(12) United States Patent
Gao et al.

(10) Patent No.: US 10,317,958 B1
(45) Date of Patent: Jun. 11, 2019

(54) TELESCOPING UNIT IN A COMPUTING DEVICE

(71) Applicant: Cisco Technology, Inc., San Jose, CA (US)

(72) Inventors: Le Gao, Shanghai (CN); Na Feng, Shanghai (CN); Yang Sun, Zhejiang (CN); Ye Peng Chen, Shanghai (CN)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/908,585

(22) Filed: Feb. 28, 2018

(51) Int. Cl.
*G06F 1/18* (2006.01)
*H05K 7/14* (2006.01)
*H05K 7/10* (2006.01)
*G11B 33/04* (2006.01)
*H05K 7/18* (2006.01)

(52) U.S. Cl.
CPC .......... *G06F 1/187* (2013.01); *G11B 33/0461* (2013.01); *H05K 7/10* (2013.01); *H05K 7/1425* (2013.01); *H05K 7/1489* (2013.01); *H05K 7/1491* (2013.01); *H05K 7/183* (2013.01)

(58) Field of Classification Search
CPC .... G06F 1/187; H05K 7/1489; G11B 33/0461
See application file for complete search history.

(56) References Cited

U.S. PATENT DOCUMENTS

| | | | | |
|---|---|---|---|---|
| 7,742,308 B1* | 6/2010 | King, Jr. | ............. | H05K 7/1489 211/26 |
| 9,030,827 B2* | 5/2015 | Jau | ............................ | G06F 1/16 211/49.1 |
| 9,265,173 B1* | 2/2016 | Jhang | .................... | G11B 33/128 |
| 9,781,857 B2* | 10/2017 | Jau | ........................... | G06F 1/183 |
| 9,795,050 B2* | 10/2017 | Chen | .................... | G11B 33/142 |
| 2015/0208543 A1* | 7/2015 | Chen | .................... | H05K 7/1489 361/679.39 |
| 2015/0366095 A1* | 12/2015 | Junkins | ................ | H05K 5/0256 361/679.31 |

(Continued)

OTHER PUBLICATIONS

Fujitsu, "High-density drive enclosure," [Accessed Online Feb. 15, 2018] <http://www.fujitsu.com/global/products/computing/storage/disk/eternus-dx/feature/high-density.html>.

(Continued)

*Primary Examiner* — Nidhi Thaker
(74) *Attorney, Agent, or Firm* — Patterson + Sheridan, LLP (57) ABSTRACT

The embodiments herein describe a computing device (e.g., a storage server) that includes at least one telescoping unit which includes a plurality of removable (or pluggable) hardware components. The computing device includes a chassis which defines a form factor of the computing device. The telescoping unit, when prompted by the user, can extend vertically from a top surface of the computing device. By doing so, the pluggable hardware components are then exposed to the user who can add or replace the components. In one embodiment, the telescoping unit includes telescoping links disposed on opposite sides which are used to guide or urge the telescoping unit vertically from the chassis. Cross links may be coupled between first and second rails where one end of each of the links is coupled to a sliding member in the rail while the other end is fixably attached to the rail.

17 Claims, 7 Drawing Sheets

(56) References Cited

U.S. PATENT DOCUMENTS

2017/0293325 A1* 10/2017 Chen .................. G06F 1/18

OTHER PUBLICATIONS

Supermicr, "BigTwin The Industry's highest-performing Twin multi-node system," [Accessed Online Feb. 19, 2018] <https://www.supermicro.com/products/mbl/BigTwin.cfm?gclid=Cj0KCQiAwKvTBRC2ARIsAL0Dgk2ZIjYmU62tFHtB6LjjJDGDey3DurJrVI9NoJZb9ezljdEq3yxcuCcaAnplEALw_wcB>.

"PowerEdge R730 Rack Server," dell.com [Accessed Feb 19, 2018] http://www.dell.com/en-us/work/shop/povw/poweredge-r730.

Docplayer, "Facebook OCP Server Hardware," [Accessed Online Feb. 27, 2018] [<http://docplayer.net/44433556-Facebook-ocp-server-hardware.html>].

* cited by examiner

FIG. 6

TELESCOPING UNIT IN A COMPUTING DEVICE

TECHNICAL FIELD

Embodiments presented in this disclosure generally relate to telescoping units in a computing device which can contain pluggable hardware components.

BACKGROUND

Storage servers are commonly used in data centers to provide short and long term data storage. The storage servers can include individual hard drives as well as support infrastructure such as power supplies, input/output (I/O) modules, fans, and the like. Two rack units (2RU) storage servers are one of the most popular used server types in the market (where one RU is a unit of measure defined as 44.5 mm or 1.75 inches). However, space in a data center for mounting the storage servers is limited. Thus, improving the arrangement of the various elements in a storage server can increase the data storage density of the data center—e.g., the storage servers can contain more hard drives in the same amount of space.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

One embodiment presented in this disclosure is a computing device that includes a chassis and a telescoping unit disposed within the chassis and configured to extend through a top surface of the chassis. The telescoping unit includes a printed circuit board (PCB) comprising connectors configured to connect to a plurality of pluggable hardware components, a cage for supporting the PCB and the pluggable hardware components, a first telescoping link connected to a first side of the cage, and a second telescoping link connected to a second side of the cage opposite the first side. Both the first and second telescoping links include an upper portion coupled to the telescoping unit, a lower portion coupled to the chassis, and two links, where one end of each of the two links is coupled to a respective one of the upper and lower portions such that the two links cross each other.

Another embodiment described herein is a telescoping unit that includes a printed circuit board (PCB) comprising connectors configured to connect to a plurality of pluggable hard drives, a cage for supporting the PCB and the pluggable hard drives, a first telescoping link connected to a first side of the cage, and a second telescoping link connected to a second side of the cage opposite the first side. Both the first and second telescoping links includes an upper portion coupled to the telescoping unit, a lower portion coupled to a structure external to the telescoping unit, and two links, where one end of each of the two links is coupled to a respective one of the upper and lower portions such that the two links cross each other. The first and second telescoping links are configured to extend the telescoping unit away from the structure when the ends of the two links move closer together in the upper and lower portions.

Another embodiment described herein is a method of operating a telescoping unit in a chassis. The method includes releasing the telescoping unit, where the telescoping unit comprises a printed circuit board (PCB) comprising connectors configured to connect to a plurality of pluggable hardware components, a cage for supporting the PCB and the pluggable hardware components, a first telescoping link connected to a first side of the cage, and a second telescoping link connected to a second side of the cage opposite the first side. The method also includes extending the telescoping unit through a top surface of the chassis by aligning two links in each of the first and second telescoping links in a same direction that the telescoping unit extends, wherein the two links cross each other, adding a pluggable hardware component to the telescoping unit, and retracting the telescoping unit through the top surface in the chassis.

Example Embodiments

The embodiments herein describe a computing device (e.g., a 2RU storage server) that includes at least one telescoping unit which includes a plurality of removable (or pluggable) hard drives. The computing device includes a chassis which defines a form factor of the computing device. The telescoping unit, when prompted by the user, can extend vertically from a top surface of the computing device. By doing so, multiple hard drives which are removably connected to the telescoping unit are then exposed to the user who can add or replace the hard drives. Once finished, the user can urge the telescoping unit back into the chassis such that a top surface of the telescoping unit is flush with a top surface of the chassis.

In one embodiment, the telescoping unit includes telescoping links disposed on opposite sides which are used to guide or urge the telescoping unit vertically from the chassis. The telescoping links may include a first rail coupled to the telescoping unit and a second rail coupled to the chassis. Cross links may be coupled between the rails where one end of each of the links is coupled to a sliding member in one of the rails, while the other is fixably attached to the other rail. When extending the telescoping unit vertically from the chassis, the sliding members align the cross links in a direction that is perpendicular to the top surface of the chassis. However, when moving the telescoping unit into the chassis, the sliding members move the cross links to align them in a horizontal direction that is parallel with the top surface of the chassis. In this manner, the telescoping links permit the telescoping unit to extend in a vertical direction out of the chassis so that the hard drives stored in the telescoping unit are easily accessible.

Figure 1:
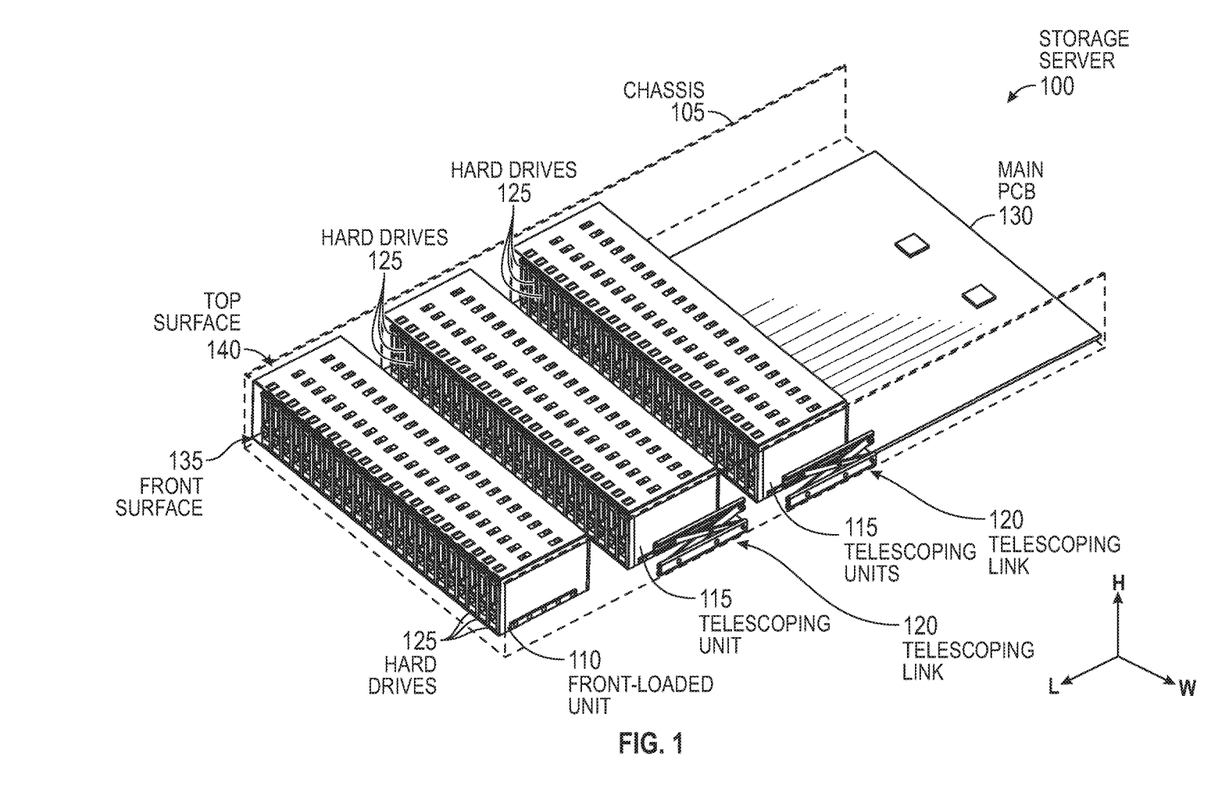
FIG. 1 is a storage server with telescoping units containing individual hard drives, according to one embodiment described herein.

FIG. 1 is a storage server 100 with telescoping units 115 containing pluggable hard drives 125, according to one embodiment described herein. In one embodiment, the storage server is a 2RU or 2U server which has a height (H) of 2RUs (e.g., around 3.25 inches). However, the storage server 100 could be a 4RU, 6RU, or other size of server. In one embodiment, the width (W) of the storage server 100 is around seventeen inches, though this can vary. The length (L) of the storage server may depend on the length (or depth) of a rack in which the storage server 100 is mounted. That is, the length may be selected to match the depth of the rack used to hold the storage server 100. Although a storage server 100 is shown in the embodiments that follow, the telescoping units 115 can be used in any computing device to hold pluggable hardware components (whether those components are hard drives 125 as shown here, or other types of pluggable computing components such as graphics processing unit (GPU) cards, PCIe cards, blade servers, and the like).

The storage server 100 includes a chassis 105 which contains a front-loaded unit 110, two telescoping units 115, and a main printed circuit board (PCB) 130. The front-loaded unit 110 and the telescoping units 115 store multiple pluggable hard drives 125. Although not shown here, the front-loaded unit 110 and the telescoping units 115 may include data and power connections to the main PCB 130 for transmitting data to and from the hard drives 125 and powering the hard drives 125. In one embodiment, the front-loaded unit 110 may store the same number of hard drives 125 as the telescoping units 115, but this is not a requirement. Moreover, in other embodiments, the chassis 105 may include only one telescoping unit 115, or more than two telescoping units 115. Further, instead of including the front-loaded unit 110, this unit may be replaced with another telescoping unit 115 (so the storage server 100 includes three telescoping units 115).

As shown, the front-loaded unit 110 and the telescoping units 115 occupy approximately half of the volume defined by the chassis 105. The remaining space in the chassis 105 may contain auxiliary hardware components such as I/O modules, cooling units (e.g., fans), and power supplies. The I/O modules may permit other computing devices to store data in, and read data from, the hard drives 125.

For clarity, a top surface 140 of the chassis 105 is transparent in FIG. 1 so that the details of the units 110, 115 can be seen. The chassis 105 also includes a front surface 135 which is perpendicular to the top surface 140. In one embodiment, the front surface 135 is a moveable panel which can be removed or flipped open so that a user can access the hard drives 125 contained in the front-loaded unit 110. For example, the front surface 135 may be mounted on hinges so that a user can flip open this portion of the chassis 105 to expose the hard drives 125. A user can then add a hard drive 125 (assuming the front-loaded unit 110 has an empty slot), remove a hard drive 125 (e.g., in response to a fault or failure), or replace a hard drive 125 with a new hard drive 125 that has a larger storage capacity (e.g., to upgrade the data storage capacity of the storage server 100). Thus, in this example, the front-loaded unit 110 can remain stationary in the chassis 105 when adding, removing, or replacing the hard drives 125 stored therein.

In contrast, the telescoping units 115 move in order to add, remove, or replace the hard drives 125. For example, the front-loaded unit 110 can block a user from accessing the hard drives 125 in the telescoping units 115 using the front surface 135. Put differently, the height of the chassis 105 and the height of the units 110, 115 may mean the user can access only the hard drives 125 in the front-loaded unit 110 using the front surface 135. Instead, the telescoping units 115 can extend (or telescope) in a vertical direction (e.g., the height direction) through the top surface 140 of the chassis 105. In one embodiment, the telescoping units 115 extend a sufficient distance so that the user can add, remove, or replace the hard drives 125 without being blocked by the chassis 105. For example, a user may press a button that releases at least one of the telescoping units 115 such that it moves a direction perpendicular to the plane defined by the main PCB 130.

In one embodiment, a top surface of the telescoping unit 115 may be flush (or aligned with) the top surface 140 of the chassis 105. For example, when stowed in the chassis 105, the top surface of the telescoping unit 115 may be on the same plane as the top surface 140. The top surface 140 of the chassis 105 may include apertures that are the same size (or a slightly larger) than the top surface of the telescoping units 115 so that the telescoping units 115 can extend above the top surface 140 of the chassis 105.

In one embodiment, the telescoping units 115 and/or the chassis 105 may include locking or latching elements which lock the telescoping units 115 in the chassis 105 until the user deactivates the locking or latching elements so that the units 115 can extend vertically away from the chassis 105. Thus, if the chassis 105 is turned upside down relative to the orientation shown in FIG. 1, the locking or latching elements prevent gravity from pulling the telescoping units 115 out of the chassis 105. Further, in one embodiment, the telescoping units 115 and/or the chassis 105 may include locking or latching elements which lock the telescoping units 115 in an extended position when adding, removing, or replacing the hard drives 125. In this example, the locking or latching elements may prevent gravity from pulling the telescoping units 115 back into the chassis 105 before the user has finished adding/removing the hardware components in the units 115. For example, after pulling out the telescoping units 115, the locking or latching elements are engaged (either by the user or automatically once the telescoping units 115 are fully extended) which prevent the telescoping units 115 from retracting into the chassis 105.

In another example, the telescoping units 115 may include lift assist elements (e.g., a spring or piston) which can overcome the force of gravity and push the telescoping units 115 out of the chassis 105 and hold the telescoping units 115 in the extended position. Once finished with the telescoping unit 115, the user can push down on the telescoping unit 115 to overcome the force applied by the lift assist element to again store the telescoping unit 115 in the chassis 105. The user can engage a locking or latching element to then store the telescoping unit 115 in the chassis 105 and prevent the lift assist element from pushing the telescoping unit 115 out of the chassis 105 once the user stops applying the downward force.

Figure 2A:
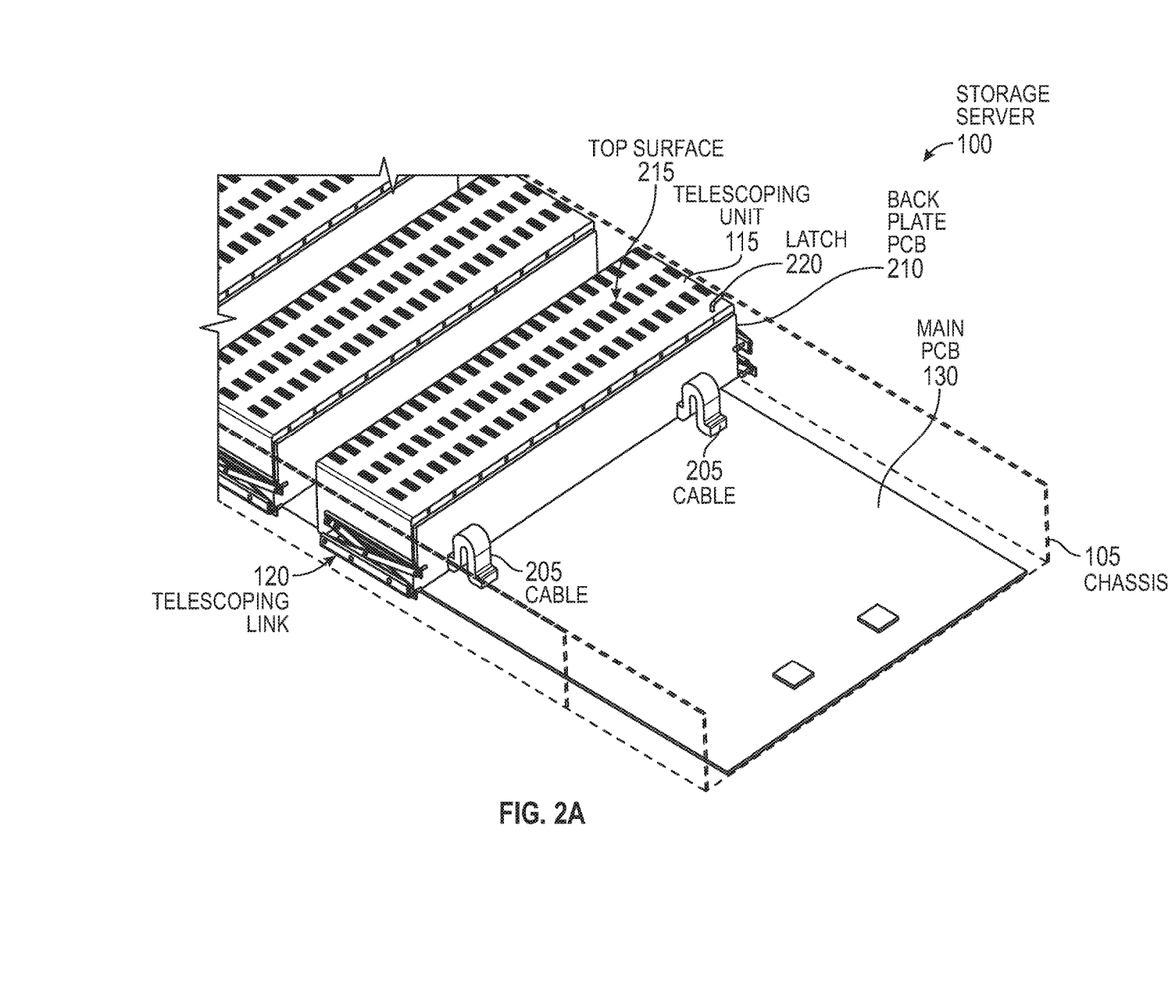
FIGS. 2A and 2B illustrate extending a telescoping unit from a storage server, according to embodiments described herein.
Figure 2B:
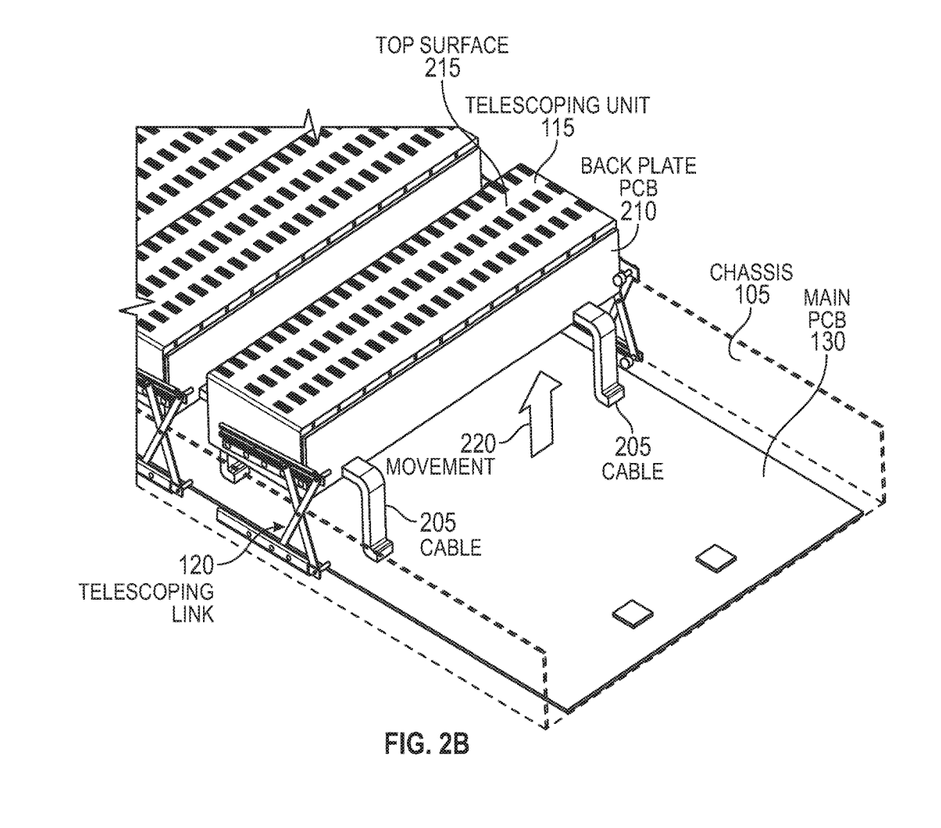

FIGS. 2A and 2B illustrate extending the telescoping unit 115 from the storage server 100, according to embodiments described herein. FIG. 2A illustrate a plan view of a back side of the storage server 100 in contrast to the view in FIG.

1 which shows the front side of the storage server 100. As viewed from the back, the telescoping unit 115 includes a back plate PCB 210 which is coupled to the hard drives 125 illustrated in FIG. 1. In one embodiment, the hard drives 125 plug into the back plate PCB 210 which in turns provides data connectivity and power to the hard drives.

The storage server 100 includes cables 205 which connect on one end to the back plate PCB 210 and on the other end to the main PCB 130. The cables 205 can include data connections (or wires) which communicatively couple the back plate PCB 210 to the main PCB 130. For example, when receiving data using I/O modules (not shown), the I/O modules may forward this data to the main PCB 130 which transfers the data, via the cables 205, to the back plate PCB 210. The back plate PCB 210 can then store the data in one of the coupled hard drives. In addition to data connections, the cables 205 can include power connections for routing power generated by power supplies in the chassis 105 to the back plate PCB 210 and to the hard drives.

In FIG. 2A, the cables 205 are folded on themselves. That is, the cables 205 have extra length (or slack) such that when the telescoping units 115 are stored in the chassis 105, the cables 205 fold over themselves or are wound up. The extra length means that the cables 205 can maintain the data and power connections between the back plate PCB 210 and the main PCB 130 when the telescoping units 115 are extending out of the chassis 105. Thus, the main PCB 130 can still read and write data to the hard drives when the telescoping unit 115 is outside of the chassis 105. For example, if one of the hard drives in the telescoping unit 115 malfunctions, the user can extend out the telescoping unit 115 and replace the non-functional hard drive without affecting the operation of the remaining, functional hard drives in the telescoping unit 115.

Although FIG. 2A illustrates two cables 205 for each telescoping unit 115, the telescoping units 115 may be coupled to the main PCB 130 using one, three, or four different cables. Moreover, the cables 205 may be fixably attached to the back plate PCB 210 using solder or a conductive epoxy or removably attached to the back plate PCB 210 using connectors (e.g., a female connector on the cable 205 and a male connector on the back plate PCB 210).

In one embodiment, the telescoping links 120 set the distance between the telescoping unit 115 and the main PCB 130 which extends below the units 115. Put differently, adjusting the telescoping links 120 controls the position of the telescoping unit 115 relative to the main PCB (and the chassis 105 as a whole). In FIG. 2A, the telescoping links 120 are in a first state which stows the telescoping unit 115 in the chassis 105 which may mean that the top surface of the unit 115 is substantially flush with the top surface of the chassis 105, or that that unit 115 has been locked into place in the chassis 105. Although it may be preferred to have the entire telescoping unit 115 contained within the chassis 105 when stowed (e.g., to prevent the unit 115 from being damaged or to reduce the overall form factor of the storage server 100), in other embodiments a portion of the telescoping unit 115 may protrude from the top surface of the chassis 105 when stowed.

FIG. 2B illustrates the relative position of the telescoping units 115 when extending from the chassis 105. That is, the telescoping units 115 are in the extended position where a user can add, remove, or replace the hard drives in the units 115. When extended, the telescoping links 120 are in a second state where the separation distance between the main PCB 130 and the telescoping unit 115 has been increased relative to when the telescoping links 120 are in the first state illustrated in FIG. 2A. A movement arrow 220 illustrates the vertical direction the telescoping unit 115 travels when moving into the extended position. In one embodiment, the telescoping links 120 guide the telescoping unit 115 such that the unit extends only in the vertical direction of the movement arrow 220 which is perpendicular to the plane established by the main PCB 130. That is, the telescoping unit 115 may extend away from the chassis 105 without rotating relative to the chassis 105 or the main PCB 130, or without substantial movements in other directions. However, in other embodiments, the telescoping unit 115 may rotate relative to the chassis when in the extended position. For example, rotating the side of the telescoping unit 115 that is opposite from the back plate PCB 210 in a direction away from the main PCB 130 (which rotates the back plate PCB 210 towards the main PCB 130) may make it easier for the user to add, remove, or replace the hard drives.

In the second state, at least a portion of the telescoping unit 115 extends from the top surface of the chassis 105. As a result, a user can access the hard drives from the front side of the storage server without being blocked by the chassis 105. When in the extended position, some of the telescoping unit 115 may remain below the top surface of the chassis 105. As mentioned above, a locking or latching element can be engaged either by the user or automatically when the telescoping unit 115 is in the extended position to keep the unit 115 from retracting back into the chassis 105.

Comparing the state of the cables 205 in FIG. 2B to their state in FIG. 2A illustrates that the extra length of slack is used to maintain the connection between the main PCB 130 and the back plate PCB 210 when the telescoping unit 115 is in the extended position. For example, data and power may still flow through the cables 205 when the telescoping unit 115 is extended. In one embodiment, because the cables 205 remain connected to the back plate PCB 210, the hard drives can be hot swapped when the telescoping units 115 are in the extended position.

Figure 3:
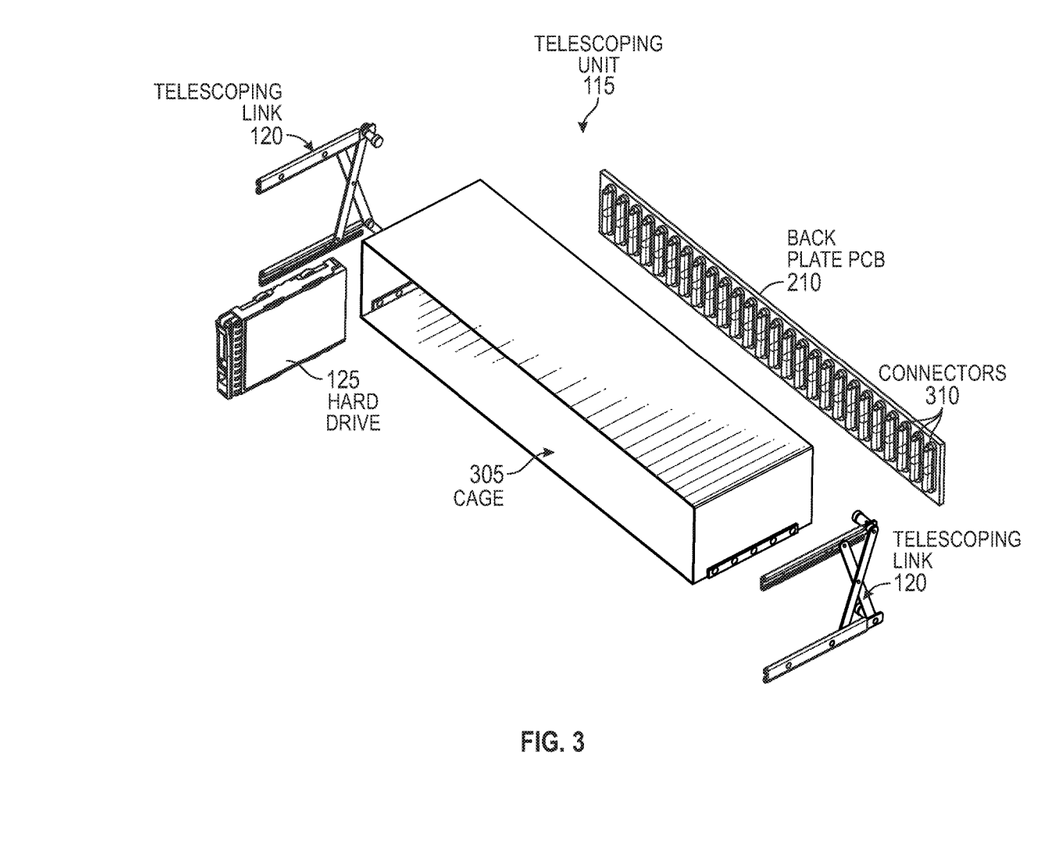
FIG. 3 illustrates an exploded view of a telescoping unit, according to one embodiment described herein.

FIG. 3 illustrates an exploded view of the telescoping unit 115, according to one embodiment described herein. In FIG. 3, selected components in the telescoping unit 115 have been separated from each other so that the details of these components can be seen more clearly. As shown, the telescoping unit 115 includes a cage 305 which encloses the hard drives 125 and can be made of any rigid material (e.g., metal or plastic). The back plate PCB 210 is mounted to a side of the cage 305 which is opposite an aperture through which the hard drives 125 can be inserted to plug the hard drives 125 into the back plate PCB 210. That is, the back plate PCB 210 includes connectors 310 which can mate with respective connectors (not shown) on the hard drives 125 when the hard drives 125 are inserted into the cage 305. Connecting the hard drives 125 into the connectors 310 support the hard drives 125 in the cage 305 and provide data and power connections to the hard drives 125. In other embodiments, the cage 305 may include features for supporting or guiding the hard drives 125, such as rails or supports which align with the connectors 310. To remove a hard drive 125, a user can reach into the aperture and grasp one of the hard drives 125 plugged into one of the connectors 310 and then pull the hard drive 125 to unplug the drive 125 from the back plate PCB 210.

The telescoping links 120 are disposed on opposite sides of the cage 305. For example, the links 120 may be bolted or welded to the cage 305. The telescoping links 120 are also coupled to the chassis (not shown). As the cage 305 is moved relative to the chassis, the telescoping links 120 can adjust to increase the height of the cage 305 relative to the chassis.

The details of the telescoping links 120 and their movement are described in FIGS. 5A and 5B below.

Figure 4:
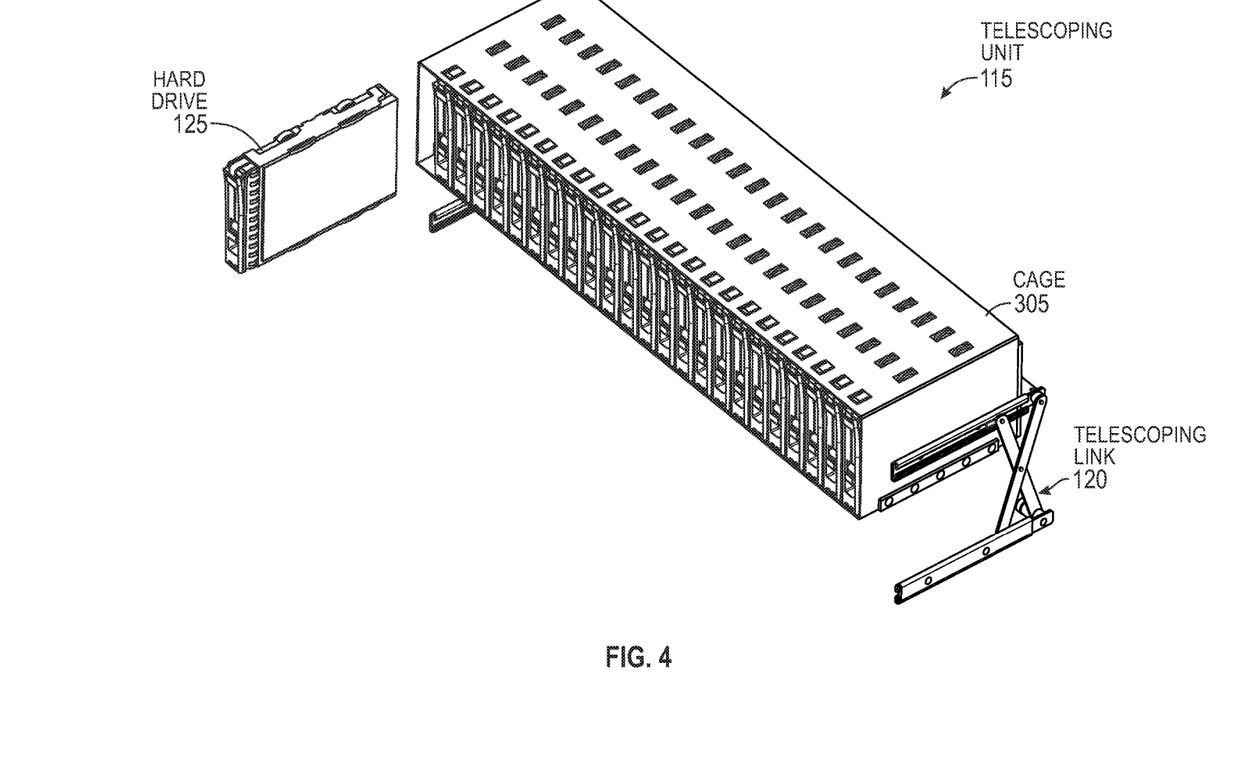
FIG. 4 illustrates a telescoping unit, according to one embodiment described herein.

FIG. 4 illustrates a telescoping unit 115, according to one embodiment described herein. FIG. 4 illustrates the telescoping unit 115 when the components illustrated in the exploded view of FIG. 3 have been connected together. Moreover, hard drives 125 have been inserted into the cage 305 and plugged into back plate PCB (not shown in FIG. 4). As shown, one of the hard drives 125 is being plugged into (or removed from) the cage 305 which may occur in the extended position when the telescopic links 120 are in the second state.

Moreover, the hard drives 125 may include fasteners that connect to the cage 305 when the hard drives 125 are plugged into the back plate PCB. For example, the hard drives 125 may include fasteners that protrude through respective apertures in the top surface of the cage 305 when the hard drives 125 have been aligned to, and successfully plugged into, the connectors. That user may be able to visually inspect the top surface of the cage and see that the fasteners on the hard drives 125 are protruding through the apertures in the cage 305, and thus, the hard drives 125 have been plugged in properly.

Figure 5A:
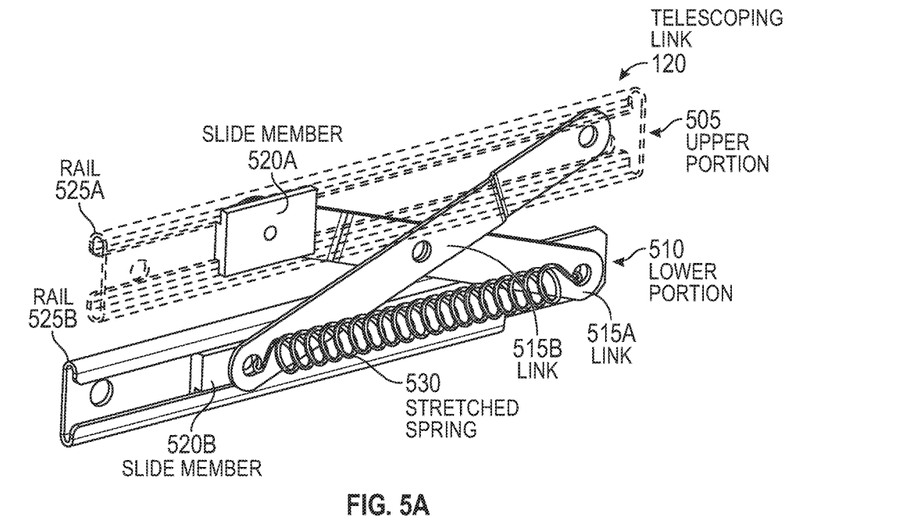
FIGS. 5A and 5B illustrate actuating a telescoping link used to extend a telescoping unit from a storage server, according to embodiments described herein.
Figure 5B:
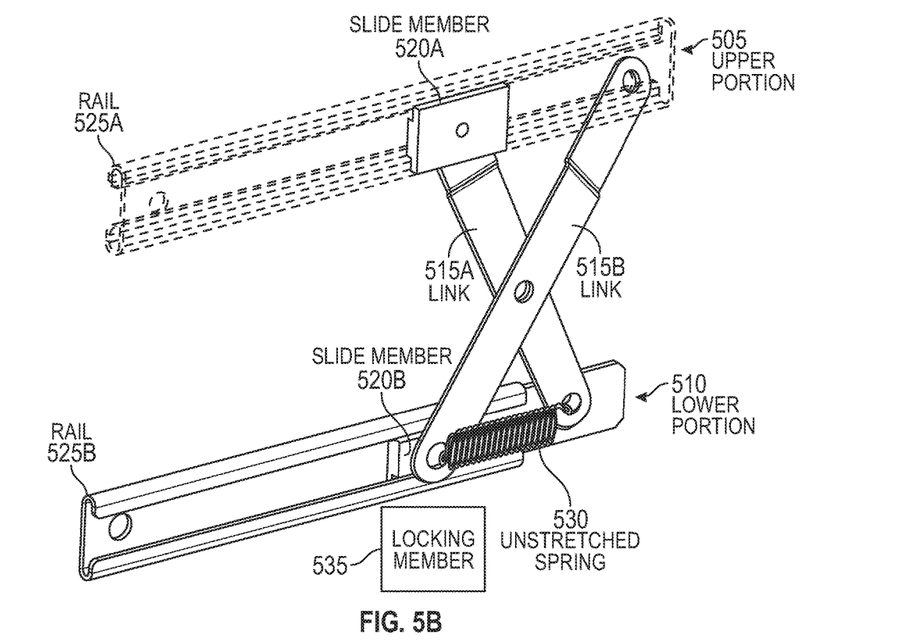

FIGS. 5A and 5B illustrate actuating the telescoping link 120 used to extend a telescoping unit from a storage server, according to embodiments described herein. FIG. 5A illustrates the telescoping link 120 in a first state where the telescoping unit is stowed in a chassis, while FIG. 5B illustrates the telescoping link 120 in a second state where the telescoping unit is in the extended position out of the chassis, thereby exposing the hard drives to a user.

The telescoping link 120 includes an upper portion 505 and a lower portion 510. The upper portion 505 includes a rail 525A which provides a guide for a slide member 520A. In one embodiment, the slide member 520A can slide in a longitudinal direction along the rail 525A to change the separation distance between the upper portion 505 and the lower portion 510. Similarly, the lower portion 510 includes a rail 525B which provides a guide for a slide member 520B. The slide member 520B can slide in a longitudinal direction along the rail 525B.

The telescopic link 120 also includes links 515A and 515B which each have one end coupled to the upper portion 505 and another end coupled to the lower portion 510. Moreover, when extending between the upper portion 505 and the lower portion 510, the links 515 are crossed to form an X or cross pattern. Thus, the links 515 can be referred to as cross links. In one embodiment, the rail 525A in the upper portion 505 is fastened to the cage of the telescoping unit 115 while the rail 525B in the lower portion 510 is fastened to the chassis of the computing device.

Moreover, the telescoping link 120 includes a spring 530 (e.g., a lift assist element) which is in a stretched state in FIG. 5A. The stretched spring 530 applies a force which pulls the end of the link 515B coupled to the slide member 520B towards the end of the link 515A coupled to the rail 525B. As such, the spring 530 applies a force which urges the ends of the links 515 together which can push the telescoping unit in a vertical direction out of the chassis. However, to counter the force applied by the stretched spring 530, a latch or lock may hold the telescoping unit in place to prevent the spring 530 from moving the unit out of the chassis. For example, the latch or lock may be controlled by a button which a user pushes in order for the spring 530 to extend the telescoping unit out of the chassis. In one embodiment, the spring 530 may be disposed in the upper portion 505, or the telescoping link 120 may include a spring on both the upper and lower portions 505, 510. Further, a spring 530 may be disposed on the telescoping links 120 on both sides of the cage of the telescoping unit.

In another embodiment, instead of (or in addition to) a spring, the telescoping link 120 can have a different lift assist element such as a piston which can push the ends of the links 515 in one of the upper and lower portions 505, 510 together. Moreover, although FIG. 5A illustrates placing the lift assist element (i.e., the spring 530) on the telescoping link 120, the lift assist element can be placed on other locations. For example, a piston may be attached on one end to the bottom of the cage and the chassis at the other end. The piston can push the chassis vertically out of the chassis as shown in FIGS. 2A and 2B.

FIG. 5B illustrates the second state of the telescoping link 120 where the slide members 520 have moved closer to the ends of the links 515 that are coupled to the rails 525. That is, when the telescoping unit moves away from the chassis, the slide members in the respective rails 525 slide towards the ends of the links 515 that are coupled to the rails. That is, the links 515 more closely align in a vertical direction that is parallel with the movement of the telescoping unit relative to FIG. 5A where the links 515 are more aligned in the horizontal direction. The movement of the slide members 520 can be caused by the user pulling the telescoping unit out of the chassis or by the spring 530 changing from the stretched state shown in FIG. 5A to the un-stretched state shown in FIG. 5B. In one embodiment, the lift assist element or elements can extend the telescoping unit from the chassis without any force being applied by the user. In another embodiment, the telescoping unit can be lifted from the chassis using a combination of forces applied by the user and the lift assist element. In one embodiment, the telescoping link (or the telescoping unit in general) may not have any lift assist elements in which case the user may apply the force required to extend the telescoping unit out of the chassis.

The telescoping link 120 includes a locking member 535 which holds the link 120 in the second state as shown. For example, the spring 530 may be insufficient for maintaining the telescoping unit in the extended position. The weight of the cage (and the hardware elements contained therein) may cause the telescoping unit to move downward back into the chassis once the user is no longer applying a force to lift the telescoping unit out of the chassis. In one embodiment, when the upper portion 505 extends a set distance from the lower portion 510, the locking member 535 engages which prevents the portions 505, 510 from moving towards each other. For example, when the slide member 520B reaches a certain location on the rail 525B, a spring-actuated lock may jut into the rail 525B to the left of the slide member 520B which prevents the slide member 520B from sliding to the left. When the user wishes to stow the telescoping unit back in the chassis, she can retract the lock which permits the slide member 520B to slide to the left. However, in other embodiments, the locking member 535 may be disposed at other locations such as at the top surface of the chassis so when a bottom surface of the cage protrudes above the top surface, the locking member 535 protrudes under the bottom surface of the cage thereby preventing the cage from retracting back into the chassis.

In one embodiment, when stowing the telescoping unit back in the chassis, the telescoping link 120 moves from the state shown in FIG. 5B to the state shown in FIG. 5A. That is, the slide members 520 slide to the left in the rails 525 which separates the ends of the links attached to the same rail 525. Doing so moves the upper portion 505 closer to the lower portion 510, which can move the telescoping unit into the chassis as shown in FIG. 2A.

The user may apply a force that stretches the spring 530 when stowing the telescoping unit. The stored energy in the spring 530 when in the stretched state can then be used as a lift assist as discussed above.

Figure 6:
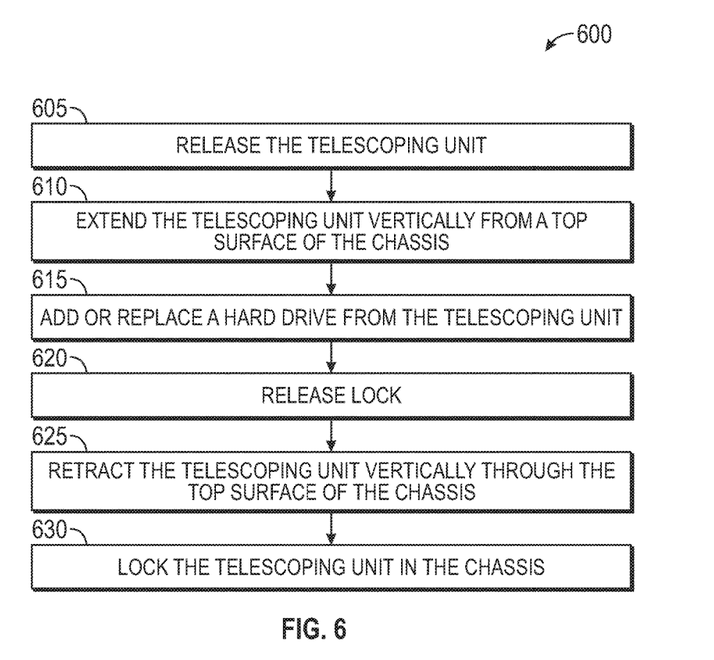
FIG. 6 is a flowchart for adding hard drives to a telescoping unit in a storage server, according to one embodiment described herein.

FIG. 6 is a flowchart of a method 600 for adding hard drives to a telescoping unit in a storage server, according to one embodiment described herein. At block 605, the user releases the telescoping unit. In one embodiment, the user may press a button that retracts a latch or lock which prevents the telescoping unit from extending out of the chassis. For example, the latch or lock may prevent a lift assist element (e.g., the spring 530 in FIGS. 5A and 5B) from pushing the telescoping unit out of the chassis. The latch or lock may also prevent the telescoping unit from extending if the chassis is upside down.

At block 610, the user and/or lift assist element extends the telescoping unit vertically from a top surface of the chassis. In one embodiment, a top surface of the telescoping unit may be parallel with the top surface of the chassis when the telescoping unit is stowed in the chassis. In another embodiment, a cover may be disposed over the telescoping unit and is removed or flipped open in order for the telescoping unit to extend through an aperture in the top surface of the chassis.

In one embodiment, extending the telescoping unit is performed by moving the telescoping links 120 from the state illustrated in FIG. 5A to the state illustrated in FIG. 5B. That is, the slide members 520 slide to the right within the rails 525 which increases the separation distance between the upper portion 505 and the lower portion 510.

At block 615, the user adds or replaces a hard drive from the telescoping unit. That is, the user may replace a non-functioning hard drive with a functioning hard drive, or upgrade a functioning hard drive with a hard drive with more memory.

In one embodiment, the remaining hard drives in the telescoping unit remain powered and operational when adding or replacing hard drives. That is, the hard drives can be hot swapped. For example, the cables 205 in FIG. 2B can maintain power and data connectivity when the telescoping unit 115 is in the extended position.

At block 620, the user releases a lock (e.g., a locking member 535 in FIG. 5B) which permits the telescoping unit to retract into the chassis. A user may press a button or pull the lock which permits the slide members 520 in the telescoping links 120 shown in FIG. 5B to slide to the left until reaching the state illustrated in FIG. 5A.

At block 625, the user retracts the telescoping unit vertically through the top surface of the chassis. That is, the user (or gravity) can stow the telescoping unit back into the chassis. In one embodiment, the user applies a force which counters a force applied by any lift assist elements which urge the telescoping unit out of the chassis.

At block 630, the user locks the telescoping unit in the chassis. In one embodiment, the lock that was released at block 605 may be reengaged by the user to hold the telescoping unit in the chassis and prevent a lift assist element from urging the telescoping unit back through the top surface of the chassis. In another embodiment, instead of the user locking the telescoping unit, the lock may be automatically reengaged once the telescoping unit is fully retracted into the chassis—e.g., when the top surface of the telescoping unit is flush with the top surface of the chassis.

In view of the foregoing, the scope of the present disclosure is determined by the claims that follow.

We claim:

1. A computing device, comprising:
   a chassis; and
   a telescoping unit disposed within the chassis and configured to extend through a top surface of the chassis, the telescoping unit comprising:
      a printed circuit board (PCB) comprising connectors configured to connect to a plurality of pluggable hardware components,
      a cage for supporting the PCB and the pluggable hardware components,
      a first telescoping link connected to a first side of the cage, and
      a second telescoping link connected to a second side of the cage opposite the first side, wherein both the first and second telescoping links comprise:
         an upper portion coupled to the telescoping unit,
         a lower portion coupled to the chassis, and
         two links, where one end of each of the two links is coupled to a respective one of the upper and lower portions such that the two links cross each other,
         wherein at least one of the first and second telescoping links comprises a lift assist element configured to apply a force to move ends of the two links closer together in the upper and lower portions when extending the telescoping unit through the top surface, wherein the lift assist element comprises a spring coupled to at least one of the upper and lower portions.

2. The computing device of claim 1, wherein the first and second telescoping links are configured to extend the telescoping unit through the top surface when the ends of the two links move closer together in the upper and lower portions.

3. The computing device of claim 2, wherein the first and second telescoping links are configured to retract the telescoping unit into the chassis when the ends of the two links move farther apart in the upper and lower portions.

4. The computing device of claim 3, wherein each of the upper and lower portions of each of the first and second telescoping links comprises:
   a slide member coupled to a first end of one of the two links; and
   a rail in which the slide member is slidably mounted, wherein the rail is a guide for the slide member to move the ends of the two links closer together and farther apart.

5. The computing device of claim 1, further comprising:
   a locking member configured to prevent the upper and lower portions from moving closer together once the upper and lower portions are separated by a predefined distance.

6. The computing device of claim 1, wherein the chassis comprises:
   a main PCB parallel to the top surface, wherein the main PCB is communicatively coupled to the PCB in the telescoping unit, wherein, when extending the telescoping unit through the top surface, the telescoping links guide the telescoping unit in a direction that is perpendicular to the main PCB.

7. The computing device of claim 6, wherein the chassis comprises:
   a cable coupled at a first end to the main PCB and at a second end to the PCB in the telescoping unit, wherein the cable comprises slack for maintaining a data connection to the pluggable hardware components when extending the telescoping unit through the top surface.

8. The computing device of claim 1, wherein the PCB is disposed perpendicular to the top surface of the chassis, wherein the pluggable hardware components comprises hard drives connected to the connectors and disposed within the cage.

9. A telescoping unit, comprising:
- a printed circuit board (PCB) comprising connectors configured to connect to a plurality of pluggable hard drives;
- a cage for supporting the PCB and the pluggable hard drives;
- a first telescoping link connected to a first side of the cage; and
- a second telescoping link connected to a second side of the cage opposite the first side, wherein both the first and second telescoping links comprise:
  - an upper portion coupled to the telescoping unit,
  - a lower portion coupled to a structure external to the telescoping unit, and
  - two links, where one end of each of the two links is coupled to a respective one of the upper and lower portions such that the two links cross each other,
  - wherein the first and second telescoping links are configured to extend the telescoping unit away from the structure when the ends of the two links move closer together in the upper and lower portions,
  - wherein at least one of the first and second telescoping links comprises a lift assist element configured to apply a force to move ends of the two links closer together in the upper and lower portions when extending the telescoping unit through a top surface of the surface, wherein the lift assist element comprises a spring coupled to at least one of the upper and lower portions.

10. The telescoping unit of claim 9, wherein the first and second telescoping links are configured to move the telescoping unit towards the structure when the ends of the two links move farther apart in the upper and lower portions.

11. The telescoping unit of claim 9, wherein each of the upper and lower portions of each of the first and second telescoping links comprises:
- a slide member coupled to a first end of one of the two links; and
- a rail in which the slide member is slidably mounted, wherein the rail is a guide for the slide member to move the ends of the two links closer together and farther apart.

12. The telescoping unit of claim 9, further comprising:
- a locking member configured to prevent the upper and lower portions from moving closer together once the upper and lower portions are separated by a predefined distance.

13. A method of operating a telescoping unit in a chassis, comprising:
releasing the telescoping unit, wherein the telescoping unit comprises a printed circuit board (PCB) comprising connectors configured to connect to a plurality of pluggable hardware components, a cage for supporting the PCB and the pluggable hardware components, a first telescoping link connected to a first side of the cage, and a second telescoping link connected to a second side of the cage opposite the first side;
extending the telescoping unit through a top surface of the chassis by aligning two links in each of the first and second telescoping links in a same direction that the telescoping unit extends, wherein the two links cross each other, wherein at least one of the first and second telescoping links comprises a lift assist element configured to apply a force to move ends of the two links closer together in (i) an upper portion of the first or second telescoping link coupled to the telescoping unit and (ii) a lower portion of the first or second telescoping link coupled to the chassis when extending the telescoping unit through the top surface, wherein the lift assist element comprises a spring coupled to at least one of the upper and lower portions;
adding a pluggable hardware component to the telescoping unit; and
retracting the telescoping unit through the top surface in the chassis.

14. The method of claim 13, wherein each of the first and second telescoping links comprise the upper portion coupled to the telescoping unit and the lower portion coupled to the chassis, wherein one end of each of the two links is coupled to a respective one of the upper and lower portions, wherein extending the telescoping unit comprises:
moving the ends of the two links closer together in the upper and lower portions.

15. The method of claim 14, wherein retracting the telescoping unit comprises:
moving the ends of the two links farther apart in the upper and lower portions.

16. The method of claim 15, wherein each of the upper and lower portions of each of the first and second telescoping links comprises:
- a slide member coupled to a first end of one of the two links; and
- a rail in which the slide member is slidably mounted, wherein the rail is a guide for the slide member to move the ends of the two links closer together and farther apart.

17. The method of claim 13, further comprising:
releasing, before retracting the telescoping unit, a locking member holding the telescoping unit in an extended position away from the chassis.

* * * * *

UNITED STATES PATENT AND TRADEMARK OFFICE
CERTIFICATE OF CORRECTION

PATENT NO. : 10,317,958 B1
APPLICATION NO. : 15/908585
DATED : June 11, 2019
INVENTOR(S) : Le Gao et al.

Page 1 of 1

It is certified that error appears in the above-identified patent and that said Letters Patent is hereby corrected as shown below:

In the Claims

In Column 11, Line 32, in Claim 9, delete "surface," and insert -- structure, --, therefor.

Signed and Sealed this
Twenty-seventh Day of August, 2019

Andrei Iancu
*Director of the United States Patent and Trademark Office*